US012713702B2

(12) United States Patent
Bhardwaj et al.

(10) Patent No.: US 12,713,702 B2
(45) Date of Patent: Aug. 18, 2026

(54) STANDARD CELL LAYOUT METHODOLOGY FOR LOW LEAKAGE SOLUTIONS

(71) Applicant: STMicroelectronics International N.V., Geneva (CH)

(72) Inventors: Anuj Bhardwaj, New Delhi (IN); Anand Kumar Mishra, Ghaziabad (IN); Rohit Kumar Gupta, Noida (IN)

(73) Assignee: STMicroelectronics International N.V., Geneva (CH)

( * ) Notice: Subject to any disclaimer, the term of this patent is extended or adjusted under 35 U.S.C. 154(b) by 407 days.

(21) Appl. No.: 18/418,051

(22) Filed: Jan. 19, 2024

(65) Prior Publication Data

US 2024/0266343 A1 Aug. 8, 2024

Related U.S. Application Data

(60) Provisional application No. 63/578,553, filed on Aug. 24, 2023, provisional application No. 63/483,464, filed on Feb. 6, 2023.

(51) Int. Cl.
*H10D 89/10* (2025.01)
*H10D 62/10* (2025.01)
(Continued)

(52) U.S. Cl.
CPC .......... *H10D 89/10* (2025.01); *H10D 62/102* (2025.01); *H10W 10/014* (2026.01); (Continued)

(58) Field of Classification Search
CPC .... H10D 89/10; H10D 62/102; H10D 62/116; H10D 84/8312; H10D 30/0221;
(Continued)

(56) References Cited

U.S. PATENT DOCUMENTS

2006/0024911 A1 2/2006 Mehrad et al.
2013/0168774 A1 7/2013 Jeon et al.
(Continued)

FOREIGN PATENT DOCUMENTS

JP 2007059910 A 3/2007

OTHER PUBLICATIONS

Priyanka, "Leakage Power Reduction in CMOS Logic Circuit Using Various Techniques," *International Journal of Research and Review* 9(11):79-85, Nov. 2022.

(Continued)

*Primary Examiner* — Chad M Dicke
*Assistant Examiner* — Gary Abel
(74) *Attorney, Agent, or Firm* — Seed Intellectual Property Law Group LLP

(57) ABSTRACT

An integrated circuit includes a semiconductor substrate patterned to include a first semiconductor track and a second semiconductor track separated from each other by a trench isolation region. The integrated circuit includes a logic circuit including a transistor having a first drain subregion in the first semiconductor track, a second drain subregion in the second semiconductor track, a first source subregion in the first semiconductor track, and a second source subregion in the second semiconductor track. A diffusion bridge of semiconductor material extends between the first and second semiconductor tracks and connects the first source subregion to the second source subregion. The first drain subregion and the second drain subregion are electrically connected by a drain metalization.

19 Claims, 10 Drawing Sheets

(51) Int. Cl.

*H10W 10/00* (2026.01)
*H10W 10/17* (2026.01)
*H10W 70/60* (2026.01)
*H10W 70/65* (2026.01)

(52) U.S. Cl.

CPC .......... *H10W 10/17* (2026.01); *H10W 70/611* (2026.01); *H10W 70/65* (2026.01)

(58) Field of Classification Search

CPC . H10W 10/014; H10W 10/17; H10W 70/611; H10W 70/65; H10W 20/40; H10W 70/60; H10W 70/652; H10W 70/6523; H10W 70/6525; H10W 70/6528; H10W 70/654; H10W 70/655; H10W 70/656; H10W 70/6565; H10W 70/657; H10W 70/658; H10W 70/614; H10W 70/616

See application file for complete search history.

(56) References Cited

U.S. PATENT DOCUMENTS

| | | | | |
|---|---|---|---|---|
| 2021/0391324 | A1 | 12/2021 | Lu et al. | |
| 2022/0376039 | A1 | 11/2022 | Braun et al. | |
| 2023/0109148 | A1* | 4/2023 | Cho | H10D 30/6757 257/206 |
| 2023/0413547 | A1* | 12/2023 | Suthram | H10B 12/00 |

OTHER PUBLICATIONS

Zhou et al., “A 40 nm Dual-Width Standard Cell Library for Near/Sub-Threshold Operation,” *IEEE Transactions On Circuits and Systems-I: Regular Papers* 59(11):2659-2577, Nov. 2012.

Ahmad et al., “TCAD Simulation of STI Stress Effect on Active Length for 130nm Technology,” 2006 IEEE International Conference on Semiconductor Electronics, Kuala Lumpur, Malaysia, Oct. 29-Dec. 1, 2006, pp. 1038-1041. (4 pages).

Akers et al., “A Model of a Narrow-Width MOSFET Including Tapered Oxide and Doping Encroachment,” *IEEE Transactions on Electron Devices* 28(12): 1490-1495, Dec. 1981. (6 pages).

Akers et al., “Threshold Voltage Models of Short, Narrow and Small Geometry MOSFET's: A Review,” Solid-State Electronics 25(7):621-641, Jul. 1982. (21 pages).

Akers, “The Inverse-Narrow-Width Effect,” *IEEE Electron Device Letters* 7(7):419-421, Jul. 1986. (3 pages).

Berge et al., “Benefits of decomposing wide CMOS transistors into minimum-size gates,” 2009 NORCHIP, Trondheim, Norway, Nov. 16-17, 2009. (4 pages).

Bhardwaj et al., “Narrow-Width Effects in 28-nm FD-SOI Transistors Operating at Cryogenic Temperatures,” *Journal of Electron Devices Society* 11:22-29, Dec. 30, 2022. (8 pages).

Chen et al., “Standard Cell Optimization for Ultra-Low-Voltage Digital Circuits,” 2019 International Conference on IC Design and Technology (ICICDT), Suzhou, China, Jun. 17-19, 2019. (4 pages).

Hsueh et al., “Inverse-Narrow-Width Effects and Small-Geometry MOSFET Threshold Voltage Model,” *IEEE Transactions on Electron Devices* 35(3):325-338, Mar. 31, 1988. (14 pages).

Liu et al., “A Study of Inverse Narrow Width Effect of 65nm Low Power CMOS Technology,” 2008 9th International Conference on Solid-State and Integrated-Circuit Technology, Beijing, China, Oct. 20-23, 2008. (4 pages).

Morris et al., “Unconventional Layout Techniques for a High Performance, Low Variability Subthreshold Standard Cell Library,” 2017 IEEE Computer Society Annual Symposium on VLSI, Bochum, Germany, Jul. 3-5, 2017, pp. 19-24. (6 pages).

Tan et al., “Experimental Investigation and Physical Explanation of Shallow Trench Isolation Stress Effect in MOSFETs,” 2017 IEEE Regional Symposium on Micro Nanoelectronics (RSM), Batu Ferringhi, Malaysia, Aug. 23-25, 2017, pp. 135-138. (4 pages).

Wang et al., “The Analysis of devise performance on a different shallow trench isolation (STI) liner scheme,” 2012 Semi Advanced Semiconductor Manufacturing Conference, Saratoga Springs, NY, USA, May 15-17, 2012, pp. 155-157. (3 pages).

* cited by examiner

STANDARD CELL LAYOUT METHODOLOGY FOR LOW LEAKAGE SOLUTIONS

BACKGROUND

Technical Field

The present disclosure generally relates to integrated circuits, and more particularly to logic cell layouts.

Description of the Related Art

Integrated circuits often include combinatorial logic circuits. The combinatorial logic circuits may participate in various processes germane to the function of the integrated circuit. The logic circuits can include logic cells such as AND gates, OR gates, NAND gates, inverters, XOR gates, etc.

The small amount of power consumption or leakage from a logic cell may be amplified by the large number of logic cells in the integrated circuit. Accordingly, low leakage solutions for extended battery life or applications such as the Internet of things are sought-after. Logic cells may be the most used part of an integrated circuit and their power contribution to the overall integrated circuit may be significant.

Many low power extended logic cells are currently designed at the expense of operating frequency or area. In other words, low power logic cells are often achieved by reducing the operating speed of the logic cells and by increasing the area layout of the logic cells.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide logic cells that have low power consumption, low area layouts, and high operating frequencies. The logic cells utilize diffusion routing between source/drain regions of transistors in order to improve performance and reduce leakage. In particular, the channel regions of some of the transistors of the logic cells are implemented in two tracks separated from each other by trench isolation regions. Accordingly, for each such transistor, the source, drain, and channel regions include portions in both tracks. Diffusion routing is implemented to connect portions of some of the source/drain regions of a transistor. The result is improved efficiency and performance without any area penalty.

In one embodiment, an integrated circuit includes a first semiconductor track, a second semiconductor track, and a first transistor having a first drain subregion in the first semiconductor track, a second drain subregion in the second semiconductor track, a first source subregion in the first semiconductor track, and a second source subregion in the second semiconductor track. The integrated circuit includes a first trench isolation region between the first semiconductor track and the second semiconductor track and isolating the first drain subregion from the second drain subregion. The integrated circuit includes a diffusion bridge of semiconductor material extending across the first trench isolation region and connecting the first source subregion to the second source subregion.

In one embodiment, a method includes forming a first semiconductor track in an integrated circuit, forming a second semiconductor track in the integrated circuit, and forming a first drain subregion and a first source subregion of a first transistor in the first semiconductor track. The method includes forming a second drain subregion and a second source subregion of the first transistor in the second semiconductor track and forming a first trench isolation region between the first semiconductor track and the second semiconductor track. The first trench isolation region isolates the first drain subregion from the second drain subregion and forms a diffusion bridge of semiconductor material connecting the first source subregion to the second source subregion.

In one embodiment, an integrated circuit includes a semiconductor substrate. The semiconductor substrate includes a first semiconductor track, a second semiconductor track separated from the first semiconductor track by a first trench isolation region, and a third semiconductor track separated from the second semiconductor track by a second trench isolation region. The integrated circuit includes a logic gate including a first transistor having a first drain subregion in the first semiconductor track, a second drain subregion in the second semiconductor track, a first source subregion in the first semiconductor track, and a second source subregion in the second semiconductor track, and a diffusion bridge of semiconductor material extending between the first source subregion and the second source subregion. The integrated circuit includes a second transistor having a source region and a drain region in the third semiconductor track.

In one embodiment, a method includes providing a low supply voltage to a logic gate of an integrated circuit. The logic gate includes a first transistor having a first drain subregion in a first semiconductor track, a second drain subregion in a second semiconductor track, a first source subregion in the first semiconductor track, and a second source subregion in the second semiconductor track. The logic gate includes a first trench isolation region between the first semiconductor track and the second semiconductor track and isolating the first drain subregion from the second drain subregion and a diffusion bridge of semiconductor material connecting the first source subregion to the second source subregion. The method includes providing a high supply voltage to the logic gate, providing a control signal a gate electrode of the first transistor extending over the first semiconductor track, the second semiconductor track, and the first trench isolation region, and outputting an output signal from the logic gate based on the control signal.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1A:
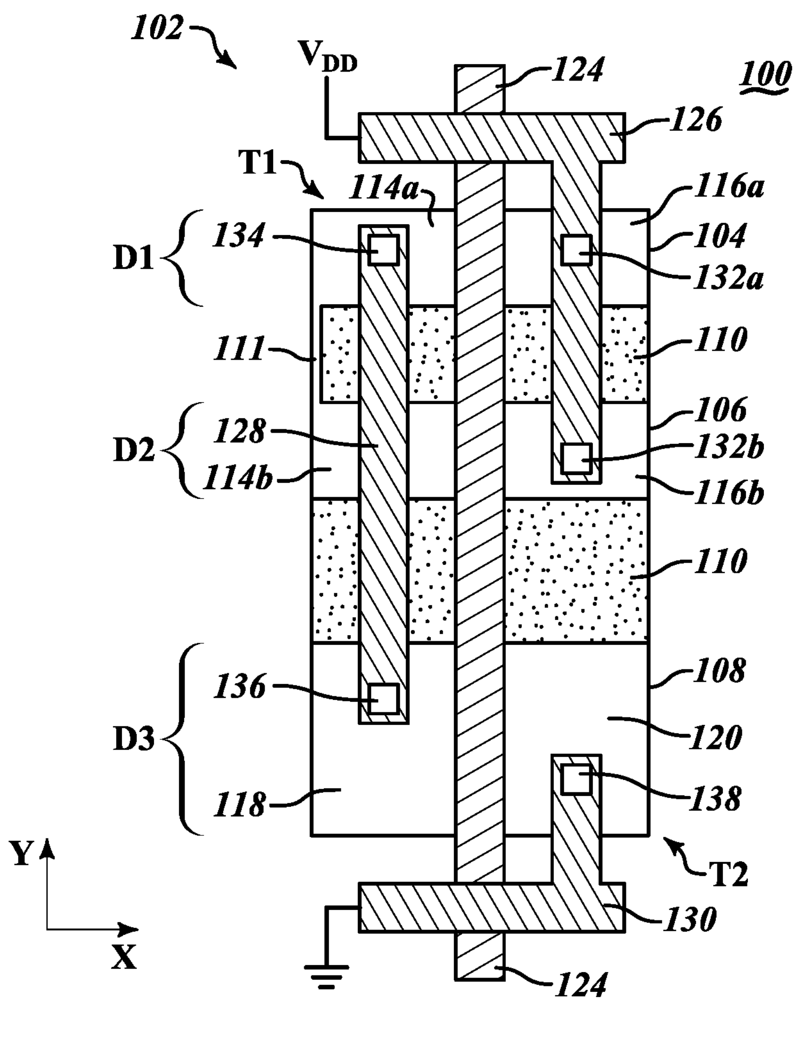
FIG. 1A is a top view of an integrated circuit including a logic cell layout, according to one embodiment.

FIG. 1A is a top view of an integrated circuit 100, according to one embodiment. The integrated circuit 100 includes a logic gate 102. The top view of FIG. 1A illustrates the layout of the logic gate 102. As will be set forth in more detail below, diffusion routing is utilized in the logic gate 102 to improve the efficiency and performance without negatively impacting area consumption.

The logic gate 102 of FIG. 1A is an inverter. However, other types of logic gates can be utilized in accordance with principles of the present disclosure without departing from the scope of the present disclosure.

The logic gate 102 includes semiconductor tracks 104, 106, and 108. The semiconductor tracks each correspond to active semiconductor area of the integrated circuit 100. The semiconductor tracks 104, 106, and 108 can include a single crystalline semiconductor material such as, but not limited to Si, Ge, SiGe, GaAs, InSb, GaP, GaSb, InAlAs, InGaAs, GaSbP, GaAsSb and InP. The semiconductor tracks 104 may include various regions that have been suitably doped with impurities (e.g., p-type or n-type conductivity). The dopants are, for example boron ($BF_2$) for a P-type transistor and phosphorus for a N-type transistor.

The logic gate 100 includes a shallow trench isolation region 110 separating the semiconductor track 104 of the semiconductor track 106. The logic gate 100 also includes a shallow trench isolation region 112 separating the semiconductor track 106 from the semiconductor track 108. The shallow trench isolation regions 110 and 112 can be utilized to separate groups of transistor structures formed in conjunction with the semiconductor tracks 104, 106, and 108. The shallow trench isolation regions 110 and 112 can include a dielectric material. The dielectric material for the shallow trench isolation regions 110 and 112 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation regions 110 and 112 without departing from the scope of the present disclosure.

A first transistor T1 is formed in conjunction with the semiconductor tracks 104 and 106. A second transistor T2 is formed in conjunction with the semiconductor track 108. In one embodiment, the first transistor T1 is a PMOS transistor and the second transistor T2 is an NMOS transistor.

The transistor T1 has a gate electrode 124 extending across the semiconductor tracks 104, 106, and 108 and the shallow trench isolation regions 110 and 112. In FIG. 1A, a single gate electrode 124 is utilized for both the transistor T1 and the transistor T2 in conjunction with the inverter design in which the gate electrodes of the two transistors are coupled together. The gate electrode can include a conductive material such as aluminum, titanium, tungsten, polysilicon, or other suitable conductive materials.

The transistor T1 includes a first drain subregion 114*a* in the first semiconductor track 104. The transistor T1 includes a second drain subregion 114*b* in the second track 106. The first drain subregion 114*a* and the second drain subregion 114*b* collectively make up a drain region of the transistor T1.

The transistor T1 includes a first source subregion 116*a* in the first semiconductor track 104. The transistor T1 includes a second source subregion 116*b* in the second track 106. The first source subregion 116*a* and the second source subregion 116*b* collectively make up a source region of the transistor T1.

The transistor T1 includes a first channel subregion in the first track 104 directly below the gate electrode 124. The transistor T1 includes a second channel subregion in the second track 106 directly below the gate electrode 124. The first channel subregion and the second channel subregion collectively make up the channel region of the transistor T1.

The semiconductor track 104 has a dimension D1 in the Y direction. The dimension D1 corresponds to the width of the first channel subregion of the transistor T1. The semiconductor track 106 has a dimension D2 in the Y direction. The dimension D2 corresponds to the width of the second channel subregion of the transistor T1. The total channel width of the transistor T1 corresponds to the sum of the dimensions D1 and D2.

In one embodiment, the transistor T1 is a P type transistor. Accordingly, the drain subregions 114*a/b* and the source subregions 116*a/b* are doped with P type dopants, as described previously. The channel region below the gate electrode 124 may be substantially undoped or intrinsic semiconductor material.

The transistor T2 includes a source region 118 in the semiconductor track 108. The transistor T2 includes a drain region 120 in the semiconductor track 108. The transistor T2 includes a channel region in the semiconductor track 108 below the gate electrode 124. The gate electrode 124 crosses over the semiconductor track 104 of the transistor T1, the semiconductor track 106 of the transistor T1, and the semiconductor track 108 of the transistor T2. Accordingly, the gate electrode 124 is shared by the transistors T1 and T2.

In one embodiment, the transistor T2 is an N type transistor. Accordingly, the drain region 118 and the source region 120 are doped with and type dopants, as described previously. The channel region below the gate electrode 124 may be substantially undoped or intrinsic semiconductor material.

The semiconductor track 108 has a width dimension D3 in the Y direction. The width dimension D3 corresponds to the channel width of the transistor T2. In one embodiment, the width dimension D3 is approximately equal to the sum of the dimensions D1 and D2. In one embodiment, the width dimension D3 is between 200 nm and 400 nm. In one embodiment, the dimensions D1 and D2 are each between 100 nm and 200 nm. In one embodiment, a portion of the shallow trench isolation region 112 separates the semiconductor track D2 from the semiconductor track D3.

The inverter 102 includes a first source metallization 126. The source metallization 126 is connected to the high supply voltage VDD. The source metallization 126 crosses over the first source subregion 116*a* and the second source subregion 116*b* of the transistor T1. The source metallization 126 is electrically coupled to the first source subregion 116*a* by a contact 132*a*. The contact 132*a* can include a conductive via extending downward from the source metallization 126 to directly contact the first source subregion 116*a*. The contact 132*a* can also include a layer of silicide as an interface between a metal on the conductive via and the semiconductor material of the source/drain subregion 116*a*. The source metallization 126 is electrically coupled to the source/drain subregion 116*b* by a contact 132*b*.

The inverter 102 includes a drain metallization 128. The drain metallization 128 crosses over the first drain subregion 114*a* and the second drain subregion 114*b*. The drain metallization 128 is electrically coupled to the drain subregion 114*a* by a contact 134. The drain subregion 128 does not include a contact that directly couples the drain metallization 128 to the drain region 114*b*.

The drain subregion 114*a* is coupled to the drain subregion 114*b* by a diffusion bridge 111 extending between the drain subregion 114*a* and the drain subregion 114*b*. In one embodiment, the diffusion bridge 111 is a same semiconductor material as the drain semiconductor tracks 104 and 106. In one embodiment, the diffusion bridge 111 is doped with the same type of dopants as the drain subregions 114*a/b*. As used herein, the diffusion bridge can also be termed diffusion routing.

As set forth previously, the drain subregion 114*b* is not directly electrically coupled to the drain metallization 128. Instead, the drain subregion 114*b* is electrically coupled to the drain subregion 114*a* by the diffusion bridge 111. The presence of the diffusion bridge 111 provides several benefits. For example, the presence of the diffusion bridge 111 results in very low leakage currents in the transistor T1 with respect to other traditional schemes. Furthermore, the reduction leakage currents is achieved with no frequency penalty. In other words, the transistor T1 can operate at very high frequencies with very low leakage based, in part, on the diffusion bridge 111 electrically coupling the drain subregion 114*b* to the drain subregion 114*a*.

In one embodiment, the diffusion bridge 111 is surrounded on both sides in the X direction by the trench isolation region 110. In one embodiment, the diffusion bridge 111 has a width between 10 nm and 30 nm in the X direction. Such a small width of the diffusion bridge 111 in the X direction can facilitate the low leakage currents while maintaining electrical coupling between the drain subregions 114*a/b*. In one embodiment, the diffusion bridge 111 has a length in the Y direction between 100 nm and 200 nm. Other dimensions can be utilized without departing from the scope of the present disclosure.

The drain metallization 128 is electrically coupled to the drain region 118 of the transistor T2 by contact 136. Accordingly, the drain region 118 of the transistor T1 is electrically coupled to the drain subregions 114*a/b* of the transistor T1.

The inverter 102 includes a source metallization 130. The source metallization 130 is coupled to ground. The source metallization 130 is electrically coupled to the source region 120 of the transistor T2 by a contact 138.

FIG. 1A does not illustrate the electrical connection that passes a voltage from the drain metallization 128. As the drain metallization 128 corresponds to the output of the inverter 102, one or more electrical connectors may be coupled to the drain metallization 128 to carry the output voltage to other circuits or components.

FIG. 1A does not illustrate the electrical connection that provides an input voltage to the gate electrode 124. As the gate electrode 124 is the input terminal of the inverter 12, the inverter 102 may include one or more electrical connectors coupled to the gate electrode 124 that provide the input voltage to the gate electrode 124.

FIG. 1A does not illustrate dielectric layers and other types of layers that may be present above the semiconductor tracks 104, 106, and 108. Some dielectric layers may be between the semiconductor tracks 104, 106, and 108 and the source/drain metallizations and gate metals.

Figure 1B:
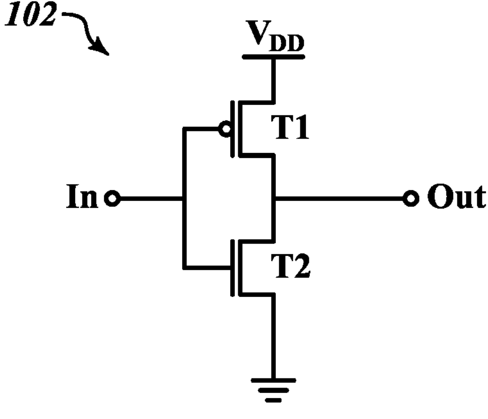
FIG. 1B is a schematic diagram of the logic cell of FIG. 1A, according to one embodiment.

FIG. 1B is a schematic diagram of the inverter 102 of FIG. 1A, according to one embodiment. The schematic diagram of FIG. 1B illustrates that the gate electrode 124 coupled to the gate terminals of the transistors T1 and T2 receives an input voltage and an input terminal In. The drain terminals of the transistors P1 and P2 are coupled together and correspond to the output terminal of the inverter 102. FIG. 1 *a* illustrates that the drain metallization 128 couples the drain terminals of the transistors T1 and T2 together. The source terminal of the transistor T1 receives VDD via the source metallization 126. The source terminal of the transistor T2 receives ground voltage via the source metallization 130.

FIGS. 2A-2B, 3A-3C, 4A-B, and 5A-5C illustrate top views and cross-sectional views of an integrated circuit 100 at various stages of processing by which the inverter 102 of FIGS. 1A and 1B may be formed, according to one embodiment.

Figure 2A:
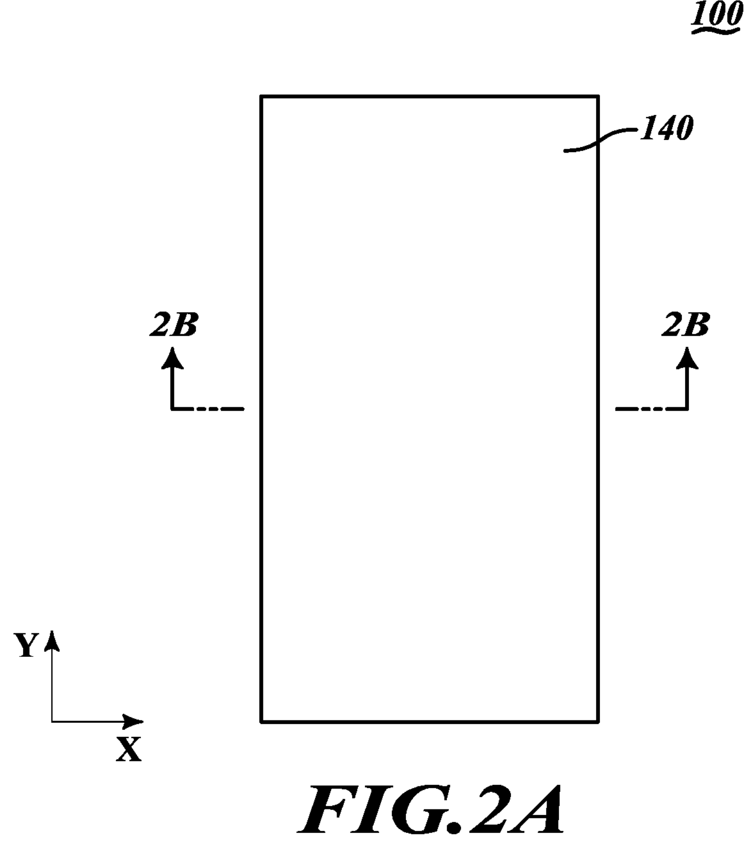
FIGS. 2A-2B, 3A-3C, 4A-B, and 5A-5C include top views and cross-sectional views of an integrated circuit at various stages of processing, according to one embodiment.

FIG. 2A is a top view of the integrated circuit 100. The integrated circuit 100 includes a semiconductor layer 140. The semiconductor layer 140 corresponds to a semiconductor layer from which the semiconductor tracks 104, 106, and 108 will be formed. Accordingly, the semiconductor layer 140 can include the same types of materials described in relation to FIG. 1A.

Figure 2B:
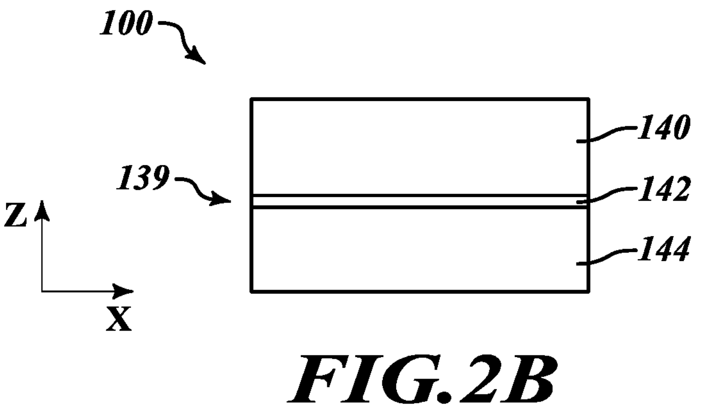

FIG. 2B corresponds to a cross-sectional view of the integrated circuit 100 at the stage of processing of FIG. 2A, taken along cut lines 2B, in accordance with one embodiment. The view of FIG. 2B illustrates a silicon on insulator (Sol) substrate 139. The SOI substrate 139 includes a bulk semiconductor layer 144, a dielectric layer 142 on the bulk semiconductor layer 144, and the semiconductor layer 140 on the dielectric layer 142. The bulk semiconductor layer 144 can have a same semiconductor material or a different semiconductor material from the semiconductor layer 140.

The dielectric layer 142 can include silicon oxide, silicon nitride, or other suitable dielectric materials.

Figure 3A:
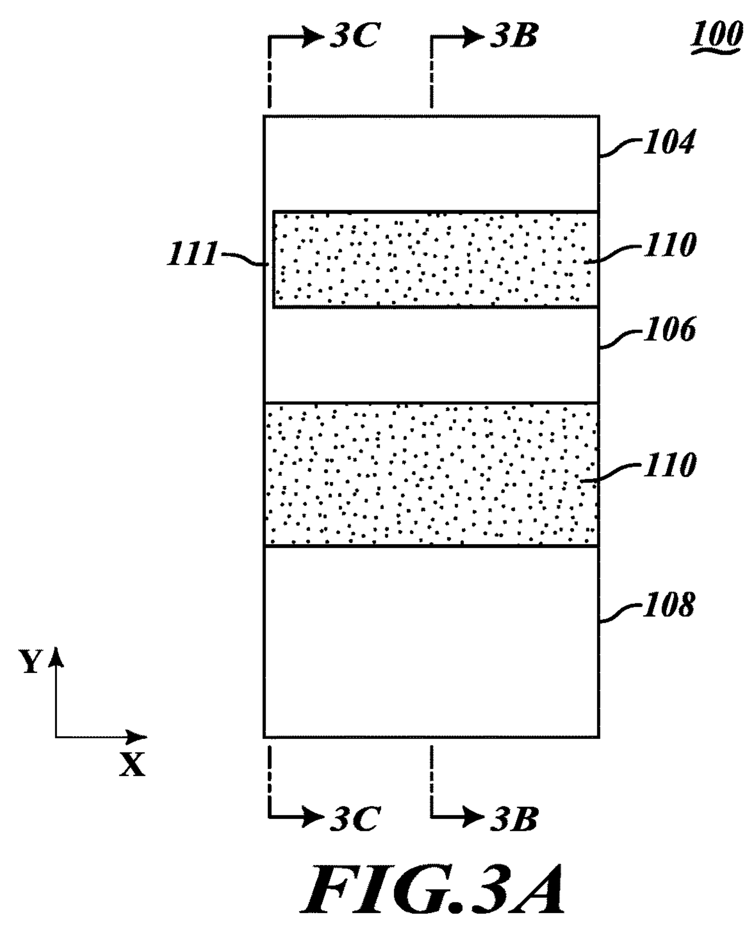

FIG. 3A is a top view of the integrated circuit 100 at an intermediate stage of processing, according to one embodiment. In the view of FIG. 3A, trench isolation regions 110 have been formed. In particular, trenches have been formed in the semiconductor layer 140 in accordance with a desired pattern. The pattern can be implemented via a photolithography process. The trenches can extend to the dielectric layer 142. After formation of the trenches, the trenches can be filled with the dielectric material of the trench isolation regions 110. The dielectric material of the trench isolation regions 110 can be as described in relation to FIG. 1A. A chemical mechanical planarization (CMP) process can be implemented to planarize the top surface of the integrated circuit 100 after formation of the trench isolation regions 110.

As can be seen in FIG. 3A, semiconductor tracks 104, 106, and 108 have been formed as a result of the patterning described in relation to FIG. 3A. Additionally, the diffusion bridge 111 has also been formed.

Figure 3B:
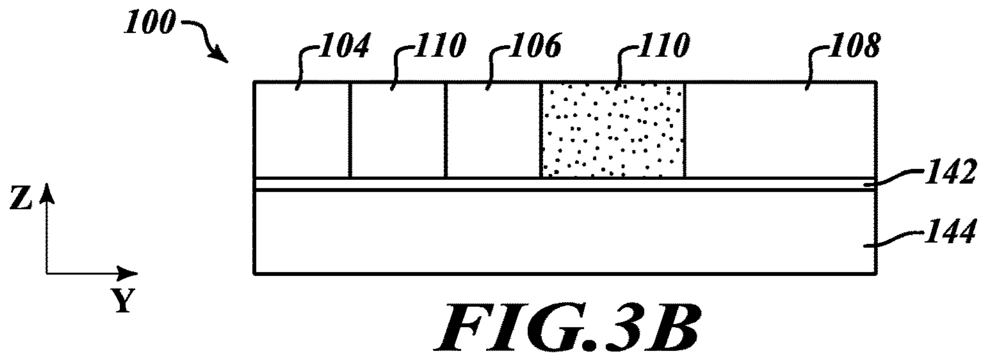

FIG. 3B is a cross-sectional view of the integrated circuit 100 of FIG. 3 *a* taken along cut lines 3B, according to one embodiment. FIG. 3B illustrates the positions of the trench isolation regions 110 extending downward to the top of the dielectric layer 142.

Figure 3C:
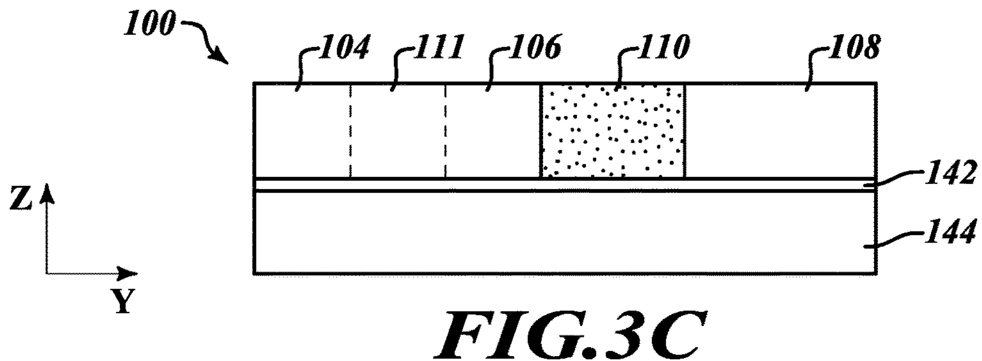

FIG. 3C is a cross-sectional view of the integrated circuit 100 of FIG. 3A taken along cut lines 3C, according to one embodiment. The cut line 3C classes in the Y direction directly through the diffusion bridge 111. As the diffusion bridge 111 has a same material as the semiconductor tracks 104 and 106, the boundaries of the diffusion bridge 111 are shown in dashed lines.

Figure 4A:
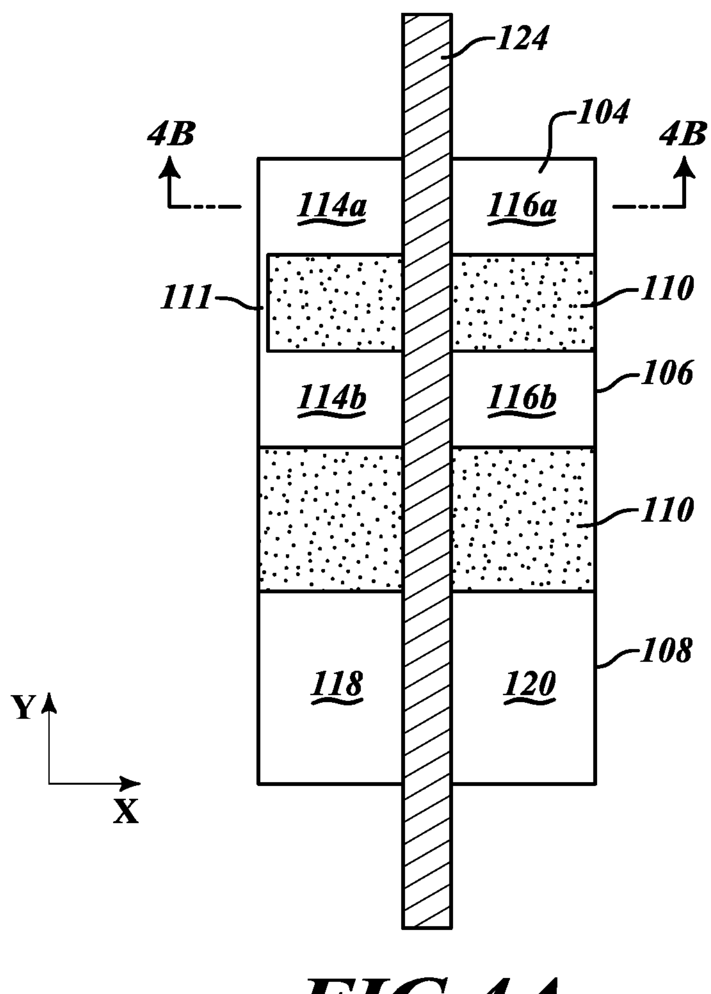

FIG. 4A is a top view of the integrated circuit 100 at an intermediate stage of processing, according to one embodiment. In FIG. 4A, a gate electrode 124 has been formed passing over the semiconductor tracks 104, 106, and 108 and passing over the trench isolation regions 110. The gate electrode 124 can include materials described in relation to FIG. 1A. After formation of the gate electrode 124, a first dopant implantation process may be formed to plant P type dopants into the semiconductor tracks 104 and 106 to form the source/drain subregions 114*a/b* and 116*a/b*. During the first dopant implantation process, a hard mask may be formed over the semiconductor track 108 to prevent P type dopants from being implanted in the semiconductor track 108. A second dopant implantation process may then be performed to implant N type dopants into the semiconductor track 108. The second dopant implantation process can include forming a hard mask over the semiconductor tracks 104 and 106.

Figure 4B:
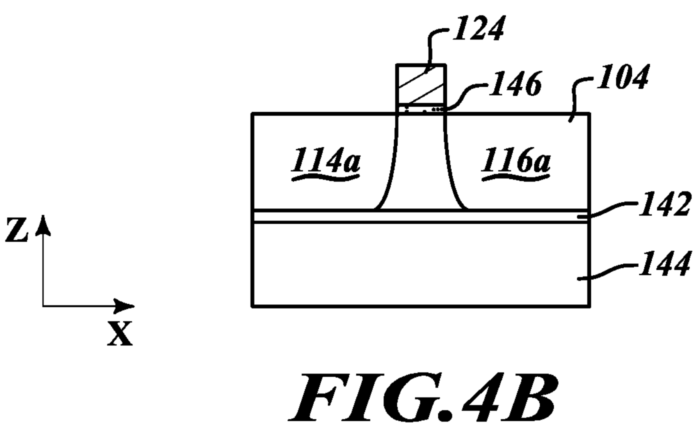

FIG. 4B is a cross-sectional view of the integrated circuit of FIG. 4A taken along cut lines 4B, in accordance with one embodiment. FIG. 4B illustrates the presence of a gate dielectric 146 directly below the gate electrode 124. The gate dielectric 146 can include silicon oxide, hafnium oxide, or other suitable dielectric materials. The channel subregion extends between the drain subregion 114*a* and the source subregion 116*a* directly below the gate dielectric 146. FIGS. 4A and 4B do not illustrate sidewall spacers or other dielectric layers that may be present.

Figure 5A:
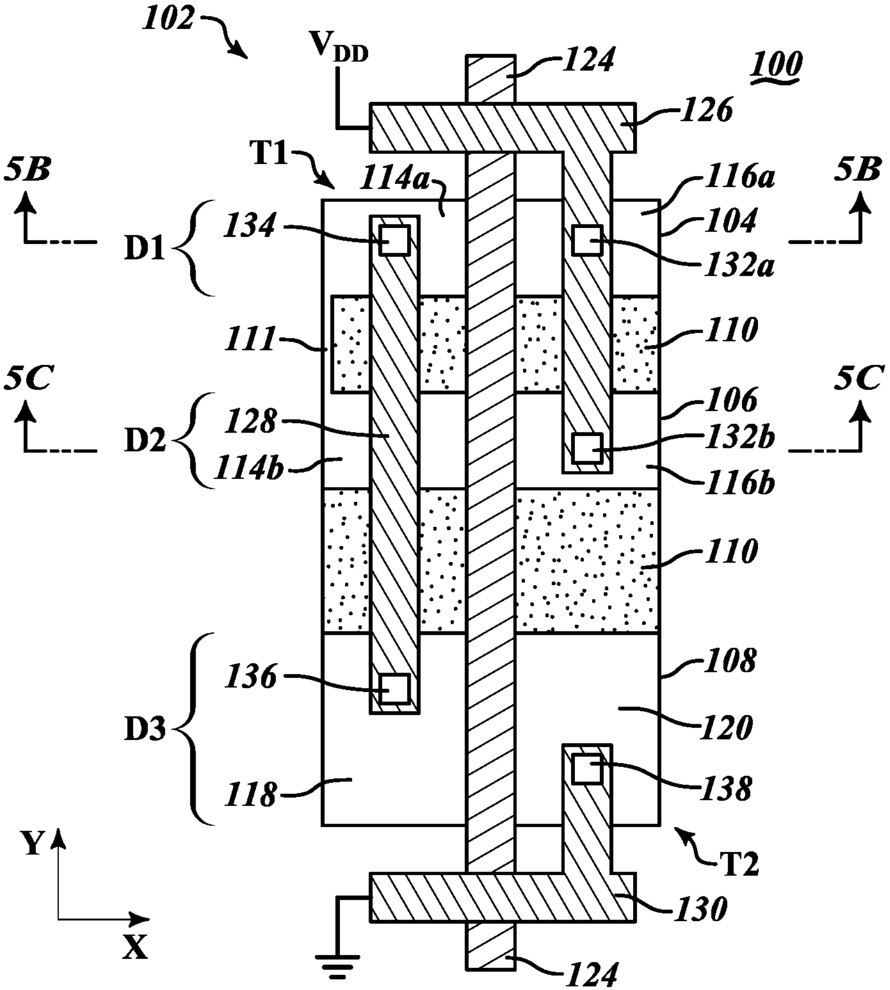

FIG. 5A is a top view of the integrated circuit 100 at the stage of processing shown in FIG. 1A, in accordance with one embodiment. The source metallizations 126 and 130 have been formed. The drain metallization 128 has been formed. The source and drain metallizations can include materials such as aluminum, titanium, tungsten, gold, or other suitable conductive materials.

In FIG. 5A, contacts 132*a/b*, 134, 136, and 138 have been formed. The contacts can include conductive vias formed in a dielectric layer 150 (see FIG. 5B) extending from the metallization to the corresponding source/drain region. The conductive vias can include tungsten, titanium, titanium nitride, aluminum, tungsten nitride, or other suitable conductive materials.

Figure 5B:
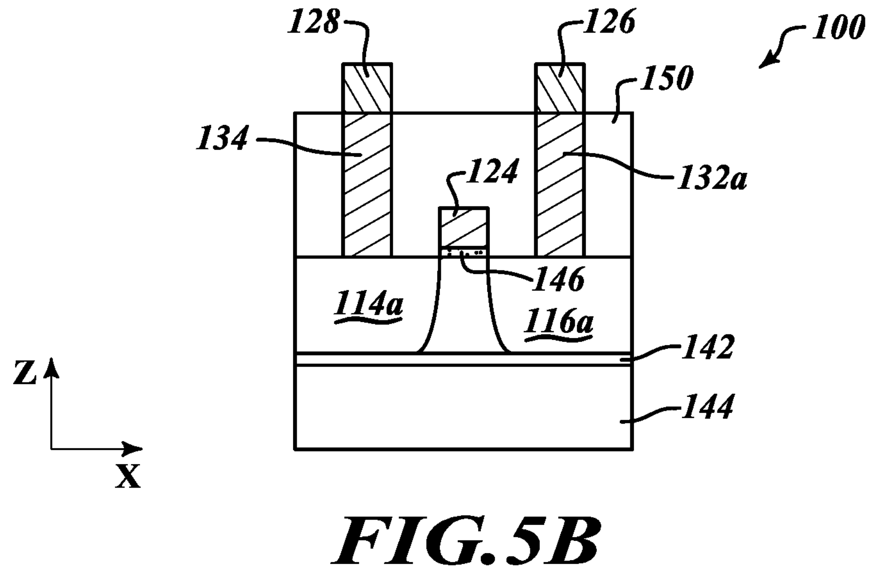

FIG. 5B is a cross-sectional view of the integrated circuit 100 of FIG. 5A taken along cut lines 5B in FIG. 5A, according to one embodiment. The view of FIG. 5A illustrates that the dielectric layer 150 has been deposited on the source/drain regions and over the gate electrode 124. The dielectric layer 150 can include silicon oxide, silicon nitride, SiCO, SiCON, SiCN, or other suitable dielectric materials.

FIG. 5B illustrates the contacts 132*a* and 134 formed as conductive vias extending from the corresponding source/drain metallization to the source/drain region. Though not shown in FIG. 5B, the contacts can include a silicide at the surface of the source/drain region. The source/drain metallizations are formed on top of the dielectric layer 150 and in contact with the contacts.

Figure 5C:
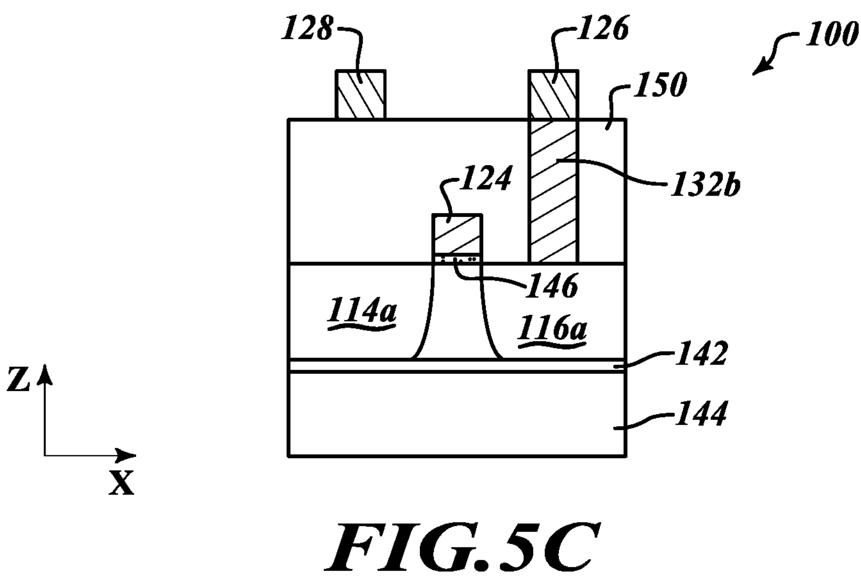

FIG. 5C is a cross-sectional view of the integrated circuit 100 of FIG. 5A, taken along cut lines 5C, in accordance with one embodiment. The view of FIG. 5C illustrates the contact 132*b*.

Figure 6A:
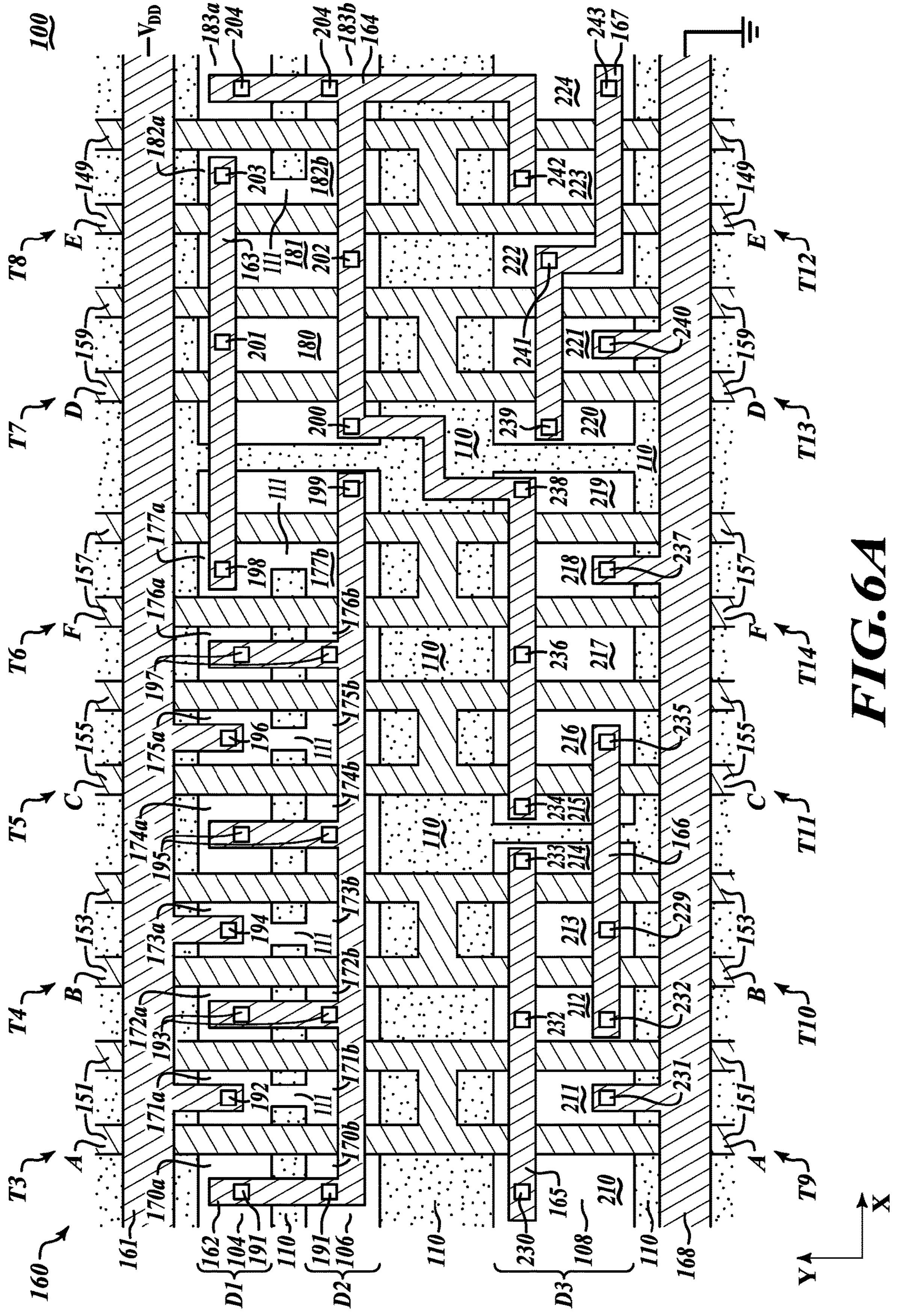
FIG. 6A is a top view of an integrated circuit including a logic cell layout, according to one embodiment.
Figure 6B:
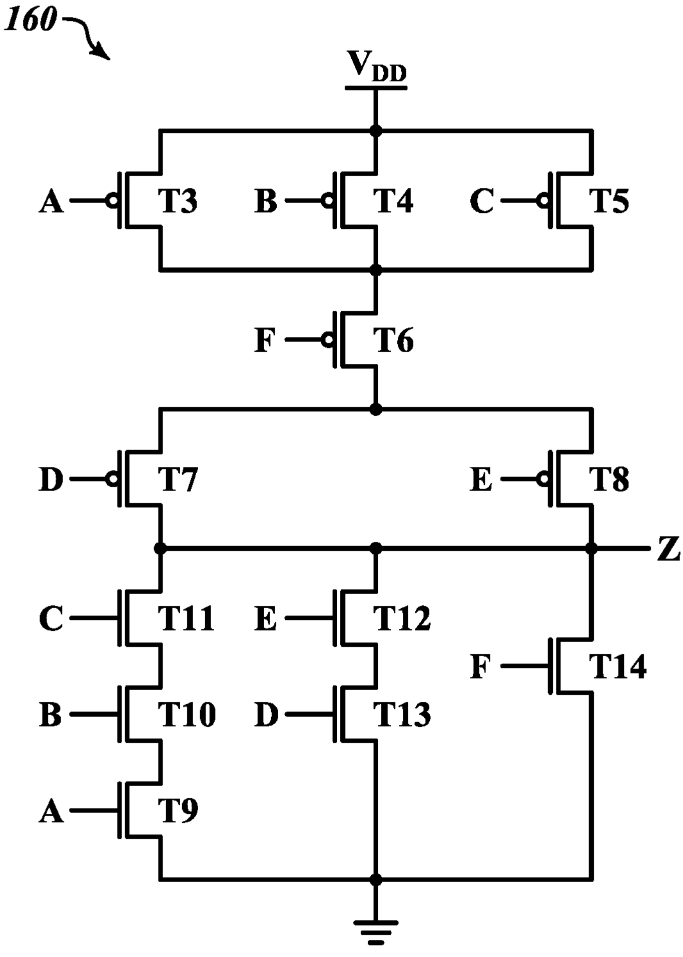
FIG. 6B is a schematic diagram of the logic cell of FIG. 1A, according to one embodiment.

FIG. 6A is a top view of an integrated circuit 100 including a logic gate 160 implementing diffusion bridge is 111, in accordance with one embodiment. The layout of FIG. 6A can utilize materials, dimensions, and principles described in relation to FIGS. 1A-5C. FIG. 6B is a schematic diagram of the logic gate 160 of FIG. 6A, in accordance with one embodiment. Prior to describing the details of FIG. 6A, the schematic layout of FIG. 6B will be described.

The logic cell 160 includes nine transistors, T3-T14 and receives six inputs A-F. The transistors T3-T8 are PMOS transistors. The transistors T3, T4, and T5 have their source terminals coupled to VDD, their drain terminals coupled together, and their gate terminals respectively receiving input signals A, B, and C. The PMOS transistor T6 has a source terminal coupled to the drain terminals of the transistors T3-T5 and receives the input signal F on its gate terminal. The PMOS transistors T7 and T8 each have their source terminals coupled to the drain terminal of the transistor T6 and their drain terminals coupled to the output Z of the logic cell 160. The gate terminal of the transistor T7 receives the input signal D. The gate terminal of the transistor T8 receives the input signal E.

The transistors T9-T14 are NMOS transistors. The transistor T9 has a source terminal coupled to ground and a gate terminal that receives the input signal A. The transistor T10 has a source terminal coupled to the drain terminal of the transistor T9 and a gate terminal that receives the input signal B. The transistor T11 has a source terminal coupled to the drain terminal of the transistor T10, a gate terminal that receives the input signal C, and a drain terminal coupled to the output Z. The transistor T12 has a drain terminal coupled to the output terminal Z and a gate terminal that receives the input signal E. The transistor T13 is a drain terminal coupled to the source terminal of the transistor T12, a gate terminal that receives the input signal D, and a source terminal coupled to ground. The transistor T14 has a drain terminal coupled to the output terminal Z, a gate terminal that receives the input signal F, and the source terminal coupled to ground. The logic cell 160 provides an output value at the output terminal Z based on the input signals A-F.

The layout of FIG. 6A illustrates how diffusion bridges or diffusion routing can be implemented in the logic cell 160 of FIG. 6B, according to one embodiment. FIG. 6 *a* illustrates a semiconductor track 104, a semiconductor track 106, and the semiconductor track 108. Trench isolation regions 110 separate the tracks. Some of the PMOS transistors include source/drain subregions and channel subregions implemented in the two semiconductor tracks 104 and 106. Diffusion bridges 111 are utilized to couple drain subregions of the transistors T3, T4, and T5. This provides area saving benefits, leakage current reduction, and high frequency operation.

Gate electrodes 151, 153, 155, 157, 159, and 149 extends across the trench isolation regions 110 and the semiconductor tracks 104, 106, and 108. In the example of FIG. 6A, each gate electrode has two prongs coupled by a horizontal bridge over the central trench isolation region 110.

The transistors T3 and T9 share the gate electrode 151 and each receives the input signal A. The transistors T4 and T10 share the gate electrode 153 and each receives the input signal B. The transistors T5 and T11 share the gate electrode 155 and each receives the input signal C. The transistors T6 and T14 share the gate electrode 157 and each receives the input signal F. The transistors T7 and T13 share the gate electrode 159 and each receives the input signal D. The transistors T8 and T12 share the gate electrode 149 and each receives the input signal E.

The transistor T3 includes a first drain subregion 170*a* and a first source subregion 171*a* implemented in the semiconductor track 104. The transistor T3 includes a second drain subregion 170*b* and a second source subregion 171*b* implemented in the second semiconductor track 106. The first drain subregion 170*a* and the second drain subregion 170*b* are each electrically coupled to a metallization 162 via a respective contact 191. The first source subregion 171*a* is coupled to the metallization 161 by a contact 192. The second source subregion 171*b* is electrically coupled to the first source subregion 171*a* by the diffusion bridge 111. Accordingly, the second source subregion 171*b* is not directly coupled to the metallization 161 by a contact.

The transistor T4 includes a first drain subregion 172*a* and a first source subregion 173*a* implemented in the semiconductor track 104. The transistor T4 includes a second drain subregion 172*b* and a second source subregion 173*b* implemented in the second semiconductor track 106. The first drain subregion 172*a* and the second drain subregion 172*b* are each electrically coupled to a metallization 162 via a respective contact 193. The first source subregion 173*a* is coupled to the metallization 161 by a contact 194. The second source subregion 173*b* is electrically coupled to the first source subregion 173*a* by the diffusion bridge 111. Accordingly, the second source subregion 173*b* is not directly coupled to the metallization 161 by a contact.

The transistor T5 includes a first drain subregion 174*a* and a first source subregion 175*a* implemented in the semiconductor track 104. The transistor T5 includes a second drain subregion 174*b* and a second source subregion 175*b* implemented in the second semiconductor track 106. The first drain subregion 174*a* and the second drain subregion 174*b* are each electrically coupled to a metallization 162 via a respective contact 195. The first source subregion 175*a* is coupled to the metallization 161 by a contact 196. The second source subregion 175*b* is electrically coupled to the first source subregion 175*a* by the diffusion bridge 111. Accordingly, the second source subregion 175*b* is not directly coupled to the metallization 161 by a contact.

The transistor T6 includes a first drain subregion 176*a* implemented in the semiconductor track 104 and second drain region 176*b* implemented in the semiconductor track 106. The transistor T6 includes a first source subregion 177*a* implemented in the semiconductor track 104 and a second source subregion 177*b* implemented in the semiconductor track 106. The first source subregion 176*a* and the second source subregion 176*b* are each electrically coupled to the metallization 162 via a respective contact 197. The first drain subregion 177*a* is coupled to the metallization 163 by a contact 198. The second drain subregion 177*b* is electrically coupled to the first drain subregion 177*a* by the diffusion bridge 111. Accordingly, the second drain subregion 177*b* is not directly coupled to the metallization 163 by a contact.

The transistor T7 includes a source region 180 implemented in a location at which the semiconductor tracks 104 and 106 are joined with no trench isolation region 110 between them. The transistor T7 includes a drain region 181. The drain region 181 is coupled to a metallization 164 via a contact 201. The source region 180 is coupled to the metallization 163 by a contact 202.

The transistor T8 includes a first source subregion 182*a* implemented in the semiconductor track 104 and second source region 182*b* implemented in the semiconductor track 106. The transistor T8 includes a first drain subregion 183*a* implemented in the semiconductor track 104 and a second drain subregion 183*b* implemented in the semiconductor track 106. The first source subregion 182*a* is electrically coupled to the metallization 163 via a contact 203. The second source subregion 182*b* is electrically coupled to the first source subregion 182*a* by a diffusion bridge 111 and is not directly coupled to a contact. The first drain subregion 183*a* and the second drain subregion 183*b* are each directly coupled to the metalization 164 by a respective contact 204.

The transistor T9 includes a drain region 210 and a source region 211 and the semiconductor track 108. A contact 230 couples the drain region 210 to the metallization 165. A contact 231 couples the source region 211 to the metallization 168, which receives ground voltage.

The transistor T10 includes a source region 212 and a drain region 213 and the semiconductor track 108. The source region 212 is coupled to the metallization 165 by a contact 232. The drain region 216 is coupled to the metallization 166 by a contact 235. A region 214 of the semiconductor track 108 is coupled to the metallization 165 by a contact 233.

The transistor T11 includes a drain region 215 and the source region 216 and the semiconductor track 108. The drain region 215 is coupled to the metallization 164 by a contact 234. The source region 216 is coupled to the metallization 166 by a contact 235. The region 215 is separated from the region 214 by a diffusion gap of trench isolation material.

The transistor T14 includes a drain region 217 and a source region 218 and the semiconductor track 108. The drain region 217 is coupled to the metallization 164 by a contact 236. The source region 218 is coupled to the metallization 168 by a contact 237. A region 219 of the semiconductor track 108 is coupled to the metallization 164 by a contact 238.

The transistor T13 includes a drain region 220 and a source region 221 in the semiconductor track 108. A diffusion gap of shallow trench isolation 110 separates the region 219 from the region 220. The drain region 220 is coupled to the metallization 167 by a contact to 39. The source region 221 is coupled to the metallization 168 by a contact 240.

The transistor T12 includes a source region 222 and a drain region 223 and the semiconductor track 108. The source region 222 is coupled to the metallization 167 by a contact 241. The drain region 223 is coupled to the metallization 164 by a contact 242. The region 224 of the semiconductor track 108 is coupled to the metallization 167 by a contact 243.

As set forth previously, the utilization of diffusion bridges 111 in some of the transistors results in low leakage currents, less area consumption, and high frequency operations. While examples herein have included diffusion bridges 111 in some of the PMOS transistors, separate semiconductor tracks and diffusion bridges 111 can also be implemented in NMOS transistors.

The use of multiple semiconductor tracks and diffusion bridges as described herein can result in significantly improved performance with less area consumption. In one example, testing indicates that when 27% of total logic cells utilize diffusion routing, leakage current is reduced by 15%. Area consumption is also reduced. Furthermore, due to the smaller size of the transistors resulting from the use of multiple semiconductor tracks in, less power is consumed. Performance improvements by taking advantage of design rules. These techniques can be asked ended to sequential logic cells in addition to combinational cells in order to make a complete low-power standard library.

Figure 7:
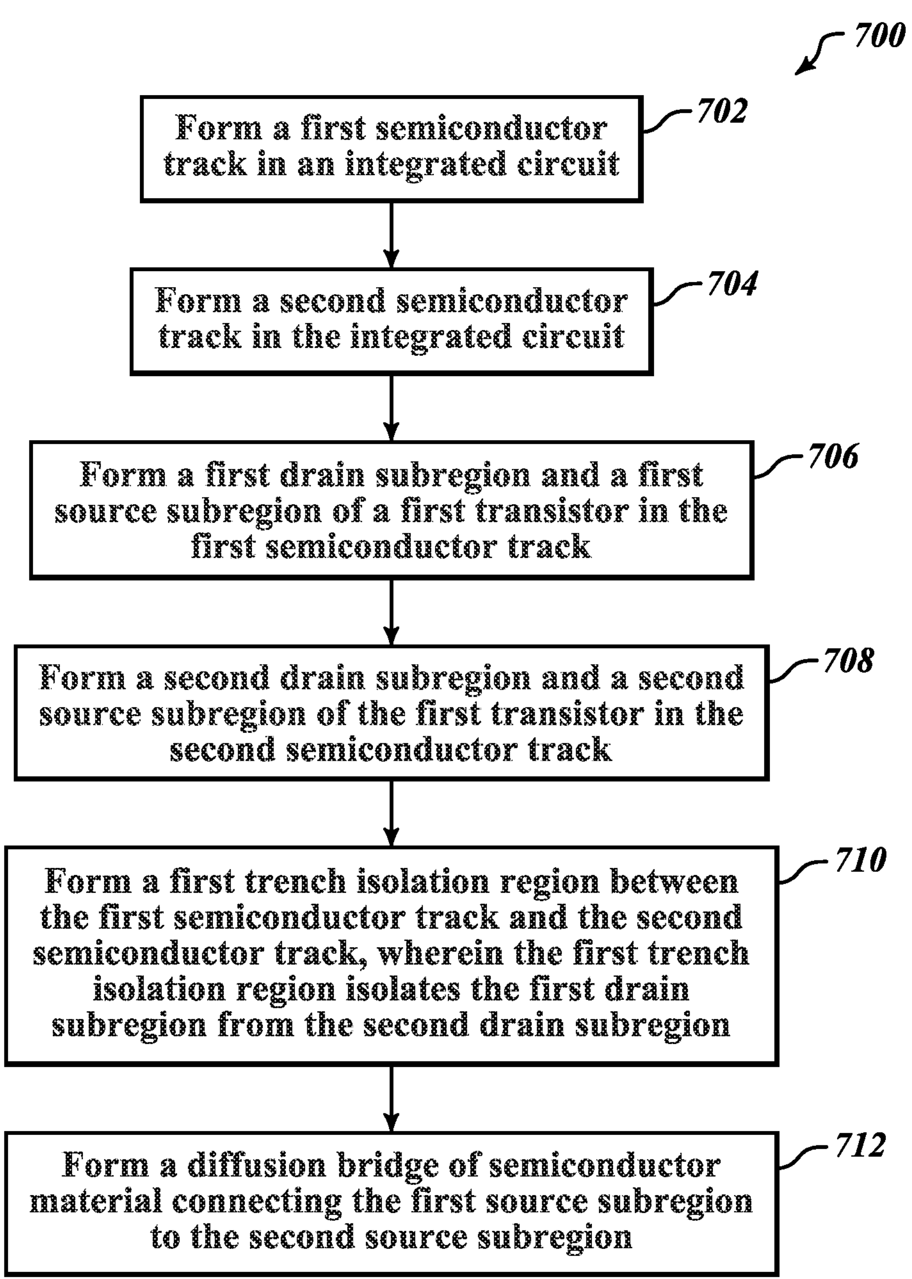
FIG. 7 is a flow diagram of a method for forming an integrated circuit, according to one embodiment.

FIG. 7 is a flow diagram of a method 700 for forming an integrated circuit, in accordance with one embodiment. The method 700 can utilize components, processes, and structures described in relation to FIGS. 1A-6B. At 702, the method 700 includes forming a first semiconductor track in an integrated circuit. At 704, the method 700 includes forming a second semiconductor track in the integrated circuit. At 706, the method 700 includes forming a first drain subregion and a first source subregion of a first transistor in the first semiconductor track. At 708, the method 700 includes forming a second drain subregion and a second source subregion of the first transistor in the second semiconductor track. At 710, the method 700 includes forming a first trench isolation region between the first semiconductor track and the second semiconductor track, wherein the first trench isolation region isolates the first drain subregion from the second drain subregion. At 712, the method 700 includes forming a diffusion bridge of semiconductor material connecting the first source subregion to the second source subregion.

Figure 8:
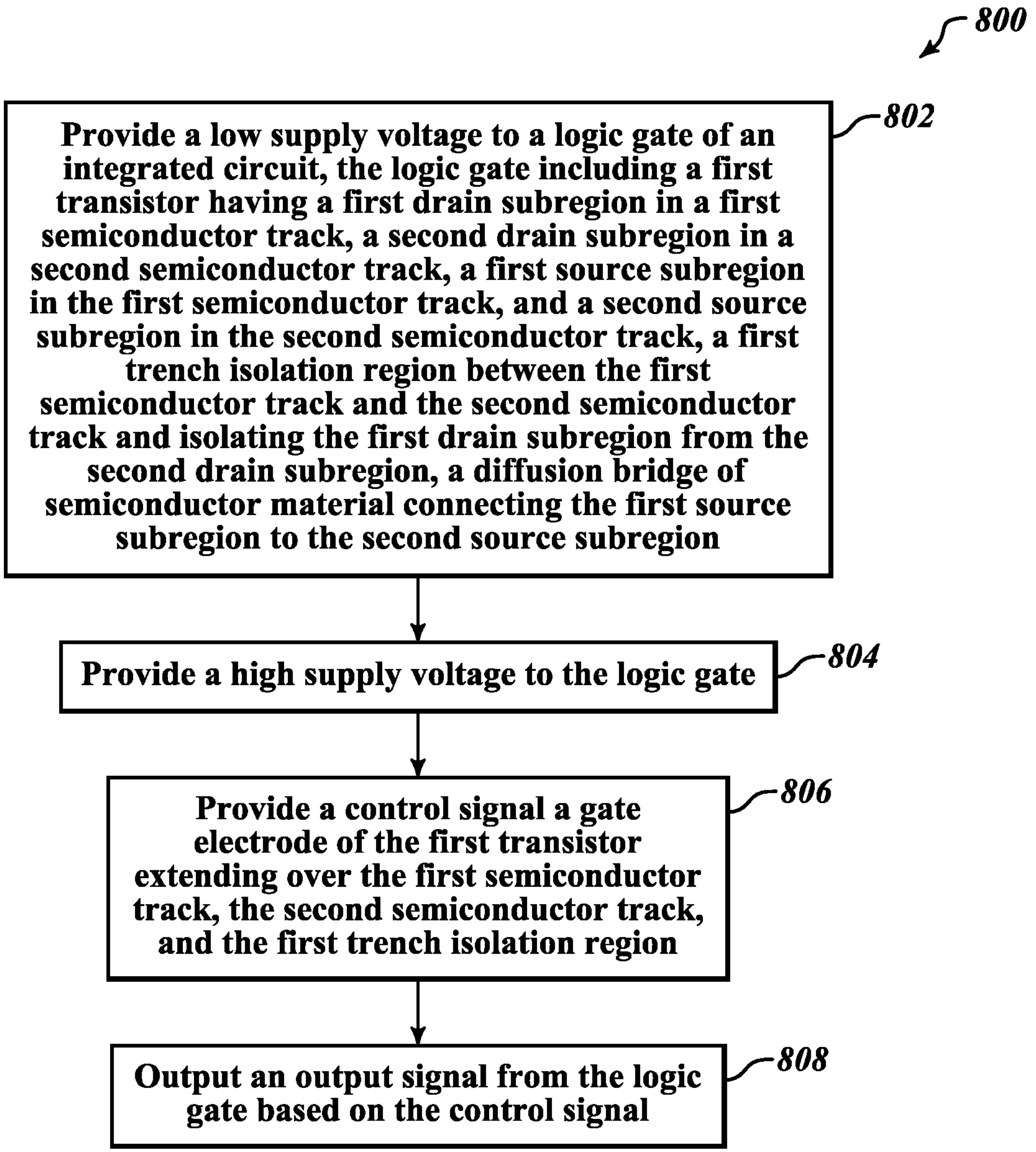
FIG. 8 is a flow diagram of a method for forming an integrated circuit, according to one embodiment.

FIG. 8 is a flow diagram of a method 800 for operating an integrated circuit, in accordance with one embodiment. The method 800 can utilize components, processes, and structures described in relation to FIGS. 1A-6B. At 802, the method 800 includes providing a low supply voltage to a logic gate of an integrated circuit. The logic gate includes a first transistor having a first drain subregion in a first semiconductor track, a second drain subregion in a second semiconductor track, a first source subregion in the first semiconductor track, and a second source subregion in the second semiconductor track. The logic gate includes a first trench isolation region between the first semiconductor track and the second semiconductor track and isolating the first drain subregion from the second drain subregion. The logic gate includes a diffusion bridge of semiconductor material connecting the first source subregion to the second source subregion. At 804, the method 800 includes providing a high supply voltage to the logic gate. At 806, the method 800 includes providing a control signal a gate electrode of the first transistor extending over the first semiconductor track, the second semiconductor track, and the first trench isolation region. At 808, the method 800 includes outputting an output signal from the logic gate based on the control signal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:

a first semiconductor track;

a second semiconductor track;

a first transistor having a first drain subregion in the first semiconductor track, a second drain subregion in the second semiconductor track, a first source subregion in the first semiconductor track, and a second source subregion in the second semiconductor track;

a first trench isolation region between the first semiconductor track and the second semiconductor track and isolating the first drain subregion from the second drain subregion; and a diffusion bridge of semiconductor material extending across the first trench isolation region and connecting the first source subregion to the second source subregion.

2. The integrated circuit of claim 1, comprising:

a first metalization extending over the first drain subregion, the first trench isolation region, and the second drain subregion; and a first drain contact electrically coupling the first metalization to the first drain subregion; and a second drain contact electrically coupling the first metalization to the second drain subregion.

3. The integrated circuit of claim 2, comprising:

a second metalization; and a second contact coupled between the second metalization and either the first or the second source subregion, wherein the second metalization is not directly coupled to the other of the first or second source subregions.

4. The integrated circuit of claim 3, comprising a gate electrode extending over the first semiconductor track, the second semiconductor track, and the first trench isolation region.

5. The integrated circuit of claim 4, wherein a channel width of the first transistor corresponds to a sum of a width of the first semiconductor track and a width of the second semiconductor track.

6. The integrated circuit of claim 5, comprising:

a third semiconductor track;

a second trench isolation region between the second semiconductor track and the third semiconductor track; and a second transistor having a drain region in the third semiconductor track and a source region in the third semiconductor track, wherein the gate.

7. The integrated circuit of claim 6, wherein the gate electrode extends across the second trench isolation region and the third semiconductor track.

8. The integrated circuit of claim 7, wherein the first transistor is a P-type transistor and the second transistor is an N-type transistor.

9. The integrated circuit of claim 7, wherein a width of the third semiconductor track is substantially equal to the sum of the width of the first semiconductor track and the width of the second semiconductor track.

10. The integrated circuit of claim 9, comprising a logic gate including the first transistor and the second transistor.

11. A method, comprising:

forming a first semiconductor track in an integrated circuit;

forming a second semiconductor track in the integrated circuit;

forming a first drain subregion and a first source subregion of a first transistor in the first semiconductor track;

forming a second drain subregion and a second source subregion of the first transistor in the second semiconductor track;

forming a first trench isolation region between the first semiconductor track and the second semiconductor track, wherein the first trench isolation region isolates the first drain subregion from the second drain subregion; and forming a diffusion bridge of semiconductor material connecting the first source subregion to the second source subregion.

12. The method of claim 11, comprising:

forming a third semiconductor track in the integrated circuit;

forming a second trench isolation region between the second semiconductor track and the third semiconductor track; and forming a drain region and a source region of a second transistor in the third semiconductor track.

13. The method of claim 12, comprising forming a gate electrode of the first transistor and the second transistor extending across the first semiconductor track, the first trench isolation region, the second semiconductor track, the second trench isolation region, and the third semiconductor track.

14. The method of claim 13, wherein a width of the third semiconductor track is substantially equal to a sum of a width of the first semiconductor track and a width of the second semiconductor track.

15. The method of claim 12, comprising forming the first semiconductor track, the second semiconductor track, and the third semiconductor track from a semiconductor layer by forming the first and second trench isolation regions in the semiconductor layer.

16. An integrated circuit, comprising:

a semiconductor substrate including:

a first semiconductor track;

a second semiconductor track separated from the first semiconductor track by a first trench isolation region; and a third semiconductor track separated from the second semiconductor track by a second trench isolation region; and a logic gate including:

a first transistor having a first drain subregion in the first semiconductor track, a second drain subregion in the second semiconductor track, a first source subregion in the first semiconductor track and a second source subregion in the second semiconductor track, and a diffusion bridge of semiconductor material extending between the first source subregion and the second source subregion; and a second transistor having a source region and a drain region in the third semiconductor track.

17. The integrated circuit of claim 16 wherein the first transistor is an NMOS transistor and the second transistor is a PMOS transistor.

18. The integrated circuit of claim 17, comprising a gate electrode of the first transistor and the second transistor extending across the first semiconductor track, the first trench isolation region, the second semiconductor track, the second trench isolation region, and the third semiconductor track.

19. The integrated circuit of claim 16, comprising a first drain contact corresponding to a conductive via in contact with the first drain subregion; and a second drain contact corresponding to a conductive via in contact with the second first drain subregion;

a drain metalization in contact with the first drain contact and the second drain contact and electrically coupling the first drain subregion to the second drain subregion;

a source contact corresponding to a conductive via in contact with the first source subregion; and a second metalization in contact with the source contact, wherein the second source subregion is electrically coupled to the second metalization via the diffusion bridge.

* * * * *